United States Patent [19]
Nanjo

[11] Patent Number: 5,668,413
[45] Date of Patent: Sep. 16, 1997

[54] SEMICONDUCTOR DEVICE INCLUDING VIA HOLE

[75] Inventor: Takeshi Nanjo, Kakogawa, Japan

[73] Assignee: Ricoh Company, Ltd., Tokyo, Japan

[21] Appl. No.: 390,135

[22] Filed: Feb. 17, 1995

[30] Foreign Application Priority Data

Feb. 18, 1994 [JP] Japan .................. 6-021102

[51] Int. Cl.$^6$ .................. H01L 23/48; H01L 23/52; H01L 29/40
[52] U.S. Cl. .................. 257/774; 257/758; 257/759; 257/773
[58] Field of Search .................. 257/734, 736, 257/750, 758, 759, 760, 773, 774, 781

[56] References Cited

U.S. PATENT DOCUMENTS 5,317,193  5/1994  Watanabe .................. 257/774
5,365,082 11/1994  Gill et al. .................. 257/775
5,442,238  8/1995  Takata .................. 257/774

*Primary Examiner*—Carl W. Whitehead, Jr.
*Attorney, Agent, or Firm*—Cooper & Dunham LLP

[57] ABSTRACT

A semiconductor device has a semiconductor material substrate a first insulating film formed on the substrate, a first metallic wiring formed partly on the first insulating film, a second insulating film formed on the first insulating film, a second metallic wiring formed partly on the second insulating film and a via hole for electrically connecting the first metallic wiring and the second metallic wiring. The via hole has a lower portion which extends below the level of a top face of the first metallic wiring and is tapered to help keep the via hole electrically insulated from the substrate.

4 Claims, 5 Drawing Sheets

1

SEMICONDUCTOR DEVICE INCLUDING VIA HOLE

BACKGROUND OF THE INVENTION

1. Field of the Invention

The present invention relates to a semiconductor device having a via hole, and a manufacturing method thereof. The invention particularly relates to a semiconductor device having a layout rule, which is that a via hole connecting an upper metallic wiring with a lower metallic wiring extends down along a side of the lower metallic wiring, and a manufacturing method thereof.

2. Discussion of the Background

As a semiconductor device becomes more complex and is scaled down further, a multilayer wiring structure is generally adopted as a wiring technique of the semiconductor device, and it becomes more important to improve the vertical alignment between a wiring and a via hole.

FIG. 8 is schematic sectional view showing an example of a semiconductor device in which the multilayer structure is adopted. In this semiconductor device, as shown in FIG. 8, a field oxide film 2 and a first gate electrode 3 are formed on a silicon (Si) substrate 1. Second gate electrodes 3' are formed on the field oxide film and are used as a wiring. An insulating film 4, typically a silicon oxide film, is formed on the first and the second electrodes 3 and 3', the field oxide film 2, and the entire substrate 1. A metallic wiring 5 of aluminum or another suitable material, which is a lower wiring, is formed on the insulating film 4. A second insulating film 6, typically a silicon oxide film, is formed on the first wiring 5 and the first insulating film 4. A second metallic wiring 8 of aluminum or another suitable material, which is an upper wiring, is formed on the second insulating film 6 in a manner similar to forming the first metallic wiring 5. The second metallic wiring 8 is electrically connected with the first metallic wiring 5 by way of the via hole 7.

However, as seen in FIG. 8, a shift in position of a mask pattern for forming the via hole causes the via hole 7 to extend laterally from the first metallic wiring 5. Therefore, a short or leakage, between the via hole 7 and the gate electrodes 3' or the silicon substrate 1 may be caused.

There is a method shown in FIG. 9 for addressing the above problem. As shown in FIG. 9, side wall spacers 9 of an amorphous silicon and the like, which typically can be etched at a different rate relative to a silicon oxide film used as the second insulating film, are formed at both sides of the metallic wiring 5, and the width of the first metallic wiring is increased substantially. As a result, it becomes less likely that a short will develop between the via hole and the gate electrodes 3' or the silicon substrate 1 disposed under the first metallic wiring 5.

However, when the side wall spacers are formed at the sides of the first metallic wiring, the space between two adjacent first metallic wirings is decreased substantially, and a margin of a step coverage of the second insulating film is decreased. Therefore, it can become more difficult to scale down the semiconductor device. Also, when the side wall spacers are formed, a step for forming a side wall spacer film and a step for etching back are added after forming the first metallic wiring 5. As a result, manufacturing costs of such devices are higher and a yield rate of such devices is decreased.

On the other hand, as seen in FIG. 10, when a material of the second metallic wiring 8 is buried into the via hole 7 using high temperature sputtering or reflow of metal, the via hole 7 is formed in a taper shape of approximately 80 degrees in order to improve a covering rate of the material of the metallic wiring. In this case, the angle θ of the taper is usually constant.

When the semiconductor device is scaled down, the size of the via hole is smaller, e.g. 0.5 μm, and the requirements for vertical alignment between the via hole and the first metallic wiring are more stringent. If the angle of the taper is approximately 80 degrees, an area in which the via hole is contacted with the first metallic wiring becomes still smaller. Therefore, a contact resistance between the via hole 7 and the first metallic wiring 5 is increased, and it becomes more difficult to achieve high speed operation of the semiconductor device.

Furthermore, Japanese Laid Open Patent 04-167524 discusses a method for controlling a taper shape of a via hole. In this method, the via hole is etched by a mixture of $CHF_3$ and $CF_4$ gas, and a flow rate of the gas is changed continuously as the etching proceeds in order to form the via hole in a taper shape. That is, a ratio of $CF_4$ is changed from 100 into 10 and then into 50 gradually so that an upper portion of the via hole can be a taper shape and a lower portion of the via hole can be a vertical shape.

However, in this method, as the lower portion of the via hole is formed in a vertical shape, there is concern that the via hole may contact the gate electrode or the silicon substrate. As a result, a short or leakage may occur between the via hole, the gate electrode and/or the silicon substrate. Also, as the upper portion of the via hole is formed in a taper shape, an area in which the via hole contacts with the first metallic wiring decreases, thereby increasing the contact resistance between the metallic wiring and the via hole. Therefore, using the technique discussed in the Japanese patent, can reduce the operational speed of the semiconductor device.

SUMMARY OF THE INVENTION

It is an object of the present invention to provide a semiconductor device which reduces the likelihood of an electrical leak or an electrical short between a via hole and a gate electrode or a silicon substrate disposed under a metallic wiring.

It is another object of the present invention to provide a semiconductor device in which a contact resistance between a via hole and a metallic wiring is decreased to permit high operational speeds of the semiconductor device.

It is another object of the present invention to provide a manufacturing method of the above described semiconductor devices.

These and other objects and advantages are achieved by the present invention which provides for a semiconductor device comprising a substrate of semiconductor material, a first insulating film formed on the substrate, a first metallic wiring formed at least partially on the first insulating film, a second insulating film formed on the first insulating film, a second metallic wiring formed at least partially on the second insulating film, and a via hole for connecting the first metallic wiring and the second metallic wiring, wherein a lower portion of the via hole extends down under a top face of the first metallic wiring, and is formed in a substantially taper shape to keep the via hole from reaching the substrate.

BRIEF DESCRIPTION OF THE DRAWINGS

In describing preferred embodiments of the present invention illustrated in the drawings, specified terminology is employed for the sake of clarity. However, the invention is not intended to be limited to the specific terminology so selected, and it is to be understood that each specific element includes suitable equivalents.

A more complete appreciation of the invention and attendant advantages thereof will be readily obtained as the same become better understood by reference to the following detailed description when considered in connection with the accompanying drawings, wherein.

DETAILED DESCRIPTION OF THE PREFERRED EMBODIMENT

Figure 1:
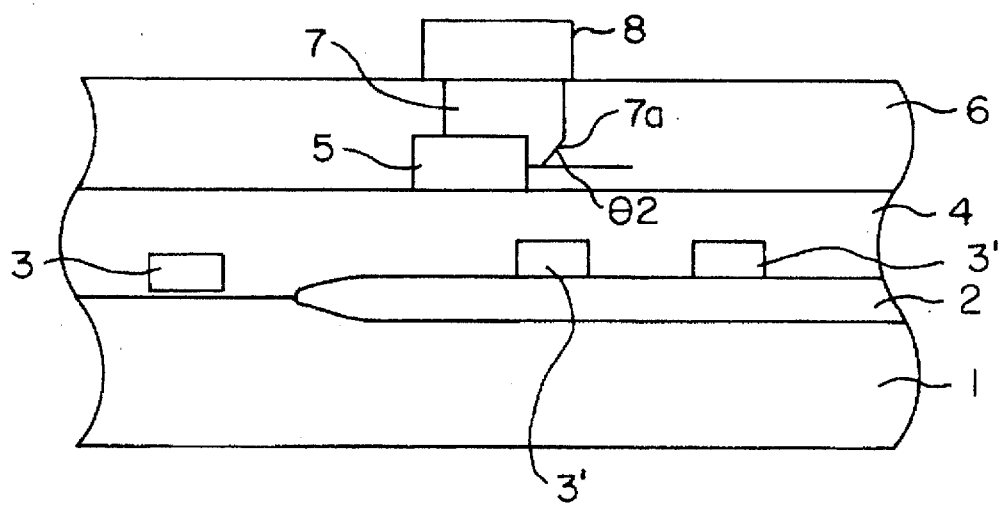
FIG. 1 is a schematic sectional view illustrating a semiconductor device of a first embodiment of the present invention.
Figure 2:
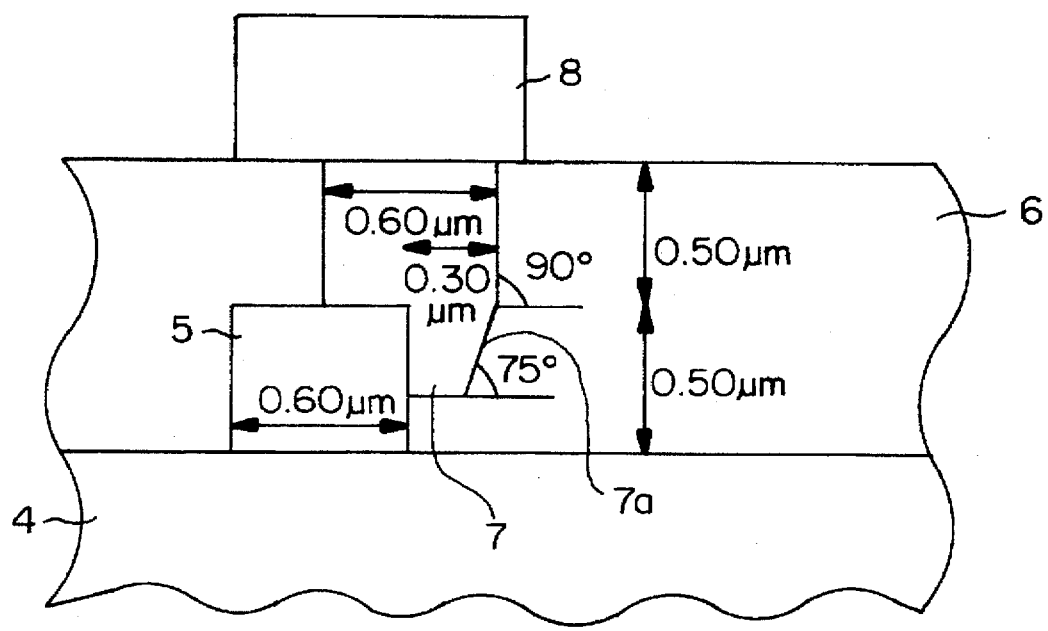
FIG. 2 is a schematic sectional view of the embodiment of FIG. 1, illustrating dimensional characteristics of the semiconductor device.

Referring now to the figures, embodiments of this invention will be described. FIGS. 1 and 2 illustrate a first embodiment of a multilayer wiring structure for semiconductor devices. As seen in FIG. 1, the semiconductor device includes, a field oxide film 2, preferably a silicon oxide film, and a first gate electrode 3 made of polysilicon, which are formed on a substrate 1. The substrate may be formed from any known substrate material, such as silicon. Second gate electrodes 3' are formed on the field oxide film 2 and are used as a wiring. A first insulating film 4, preferably a silicon oxide film, is formed on the substrate 1 and a first metallic wiring 5, which is a lower wiring, is formed on the first insulating film 4. The first metallic wiring 5 is preferably composed of an aluminum. However, metals and alloys having similar melting point and/or multilayer wiring characteristics are also contemplated.

A second insulating film 6 of a silicon oxide is formed on the first insulating film 4. The second insulating film 6 can be formed at least partially from silicon oxide, silicon nitride and the like. A second metallic wiring 8 of the same or similar material and structure as the first metallic wiring 5, is formed on the second insulating film 6.

A via hole 7 is formed by plasma etching using a reactive gas in order to electrically connect the second metallic wiring 8 to the first metallic wiring 5. The via hole 7 extends down along a side of the first metallic wiring in a layout rule, as seen in FIGS. 1 and 2. In the via hole 7 of this invention, a taper angle of an upper portion of via hole 7 is different from that of a lower portion 7a. The taper angle of the lower portion 7a is formed by over-etching and is, for example, 88 degrees or less.

At least one portion of the via hole 7 of this invention can be formed in a taper shape by changing the plasma etching parameters in steps when forming the via hole.

A manufacturing method for forming the via hole 7 is as follows. As noted, the preferred technique for creating the via hole is by plasma etching. Systems for plasma etching are known. An end of an etching cycle of the via hole 7 is detected by monitoring a luminous intensity of the plasma. To illustrate, when the etching of the upper portion of the insulating film 6 over the top face 5a of the first metallic wiring 5 has been completed, the amount of etched material is decreased. Therefore, the end of the etching cycle can be detected. Over-etching of 30–100 percent is achieved by further executing the etching cycle to form the taper in the via hole. The percentage of over-etching is dependent on, for example, the uniformity of the etching and the difference of thickness of the second insulating film 6. Thus, as seen in FIG. 1, the via hole 7 extends down along a side of the metallic wiring 5 because the oxide layer 6 is etched deeper along a side of wiring 5 due to this over-etching.

To reduce or prevent leakage between the via hole 7 and the substrate 1 or the gate electrodes 3', the etching conditions are changed when the end of an etching cycle is detected and the taper angle of the lower portion 7a of the via hole 7 is made narrower, so as to keep the via hole 7 from reaching the substrate or the gate electrode, i.e., to keep the via hole insulated from the substrate and gate electrode. The change in the taper angle of the via hole 7 can be achieved by, for example, changing an etching pressure, changing a flow rate of an etching gas, or changing the kind of etching gas used.

Next, referring to FIG. 2, an example of dimensional characteristics for the semiconductor device will be described. The exemplary semiconductor device described herein adopts the following layout rule. The width of the first metallic wiring is 0.60 µm, the diameter of the via hole 7 is 0.60 µm, the thickness of the upper portion of the second insulating film 6 over the top face 5a of the metallic wiring 5 is 0.50 µm, the thickness of the lower portion of the second insulating film 6 under the top face 5a of the metallic wiring 5 is 0.50 µm, and the width of the portion of the via hole 7 which extends laterally from the first metallic wiring is 0.30 µm.

In this semiconductor device, the etching is set to be changed in two steps so that the angle of the upper portion 7b of via hole 7 can be about 90 degrees and that of the lower portion 7a of via hole 7 can be about 75 degrees in a taper shape.

At this time, etching of a bottom face of the via hole 7 extending from the first metallic wiring 5 becomes more difficult due to a lie-lag effect as the over-etching process proceeds. Therefore, as the bottom face of via hole 7 becomes narrower, leakage between the via hole 7 and the silicon substrate 1 or the gate electrodes 3' can be reduced or prevented.

Next, referring to FIGS. 3 and 4, a second embodiment of the multilayer wiring structure for semiconductor devices will be described. In this second embodiment, the structure of the semiconductor devices is substantially similar to the structure of the first embodiment. Therefore, the same or similar elements are identified by the same numbers and the description of similar features will be omitted for the sake of convenience.

Figure 3:
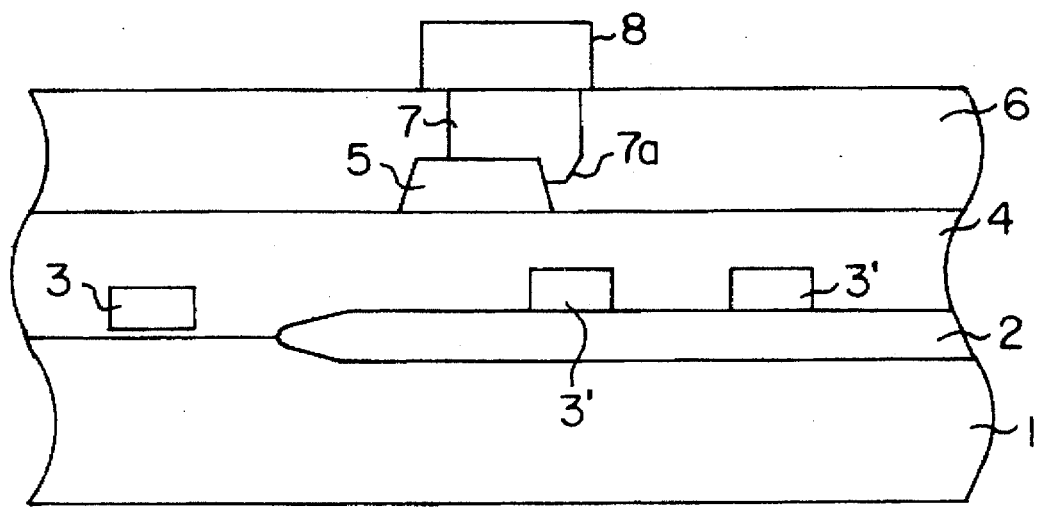
FIG. 3 is a schematic sectional view illustrating a semiconductor device of a second embodiment of the present invention.
Figure 4:
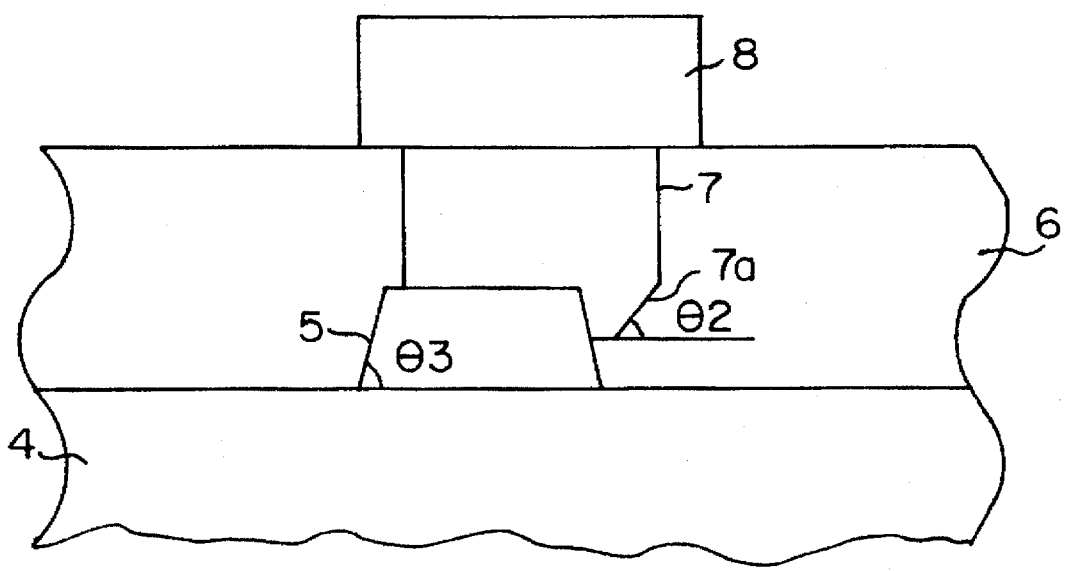
FIG. 4 is a schematic sectional view greatly enlarged of the semiconductor device of FIG. 3, illustrating a via hole connecting first and second wirings of the semiconductor device.

In this second embodiment, shown in FIGS. 3 and 4, the first metallic wiring 5 is tapered at a predefined angle $\theta_3$ which is 88 degrees or less. RF power is controlled and/or a depositional gas, for example, silicon tetrachloride ($SiCl_4$) or ammonia ($NH_3$), is used in the plasma etching cycle when forming the taper in the metallic wiring.

Figure 5:
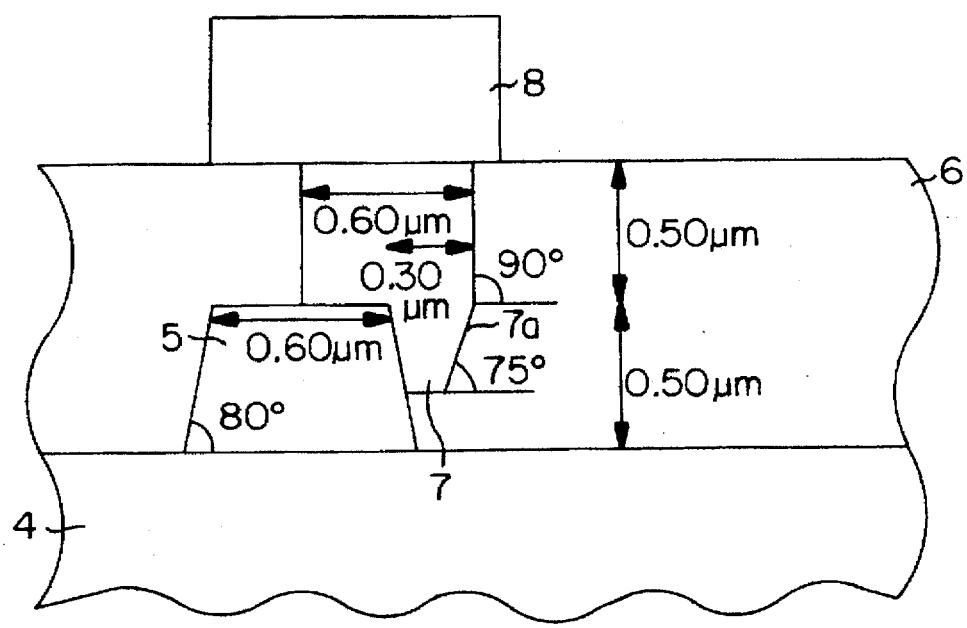
FIG. 5 is a schematic sectional view greatly enlarged of the embodiment of FIG. 3, illustrating dimensional characteristics of the semiconductor device.
Figure 10:
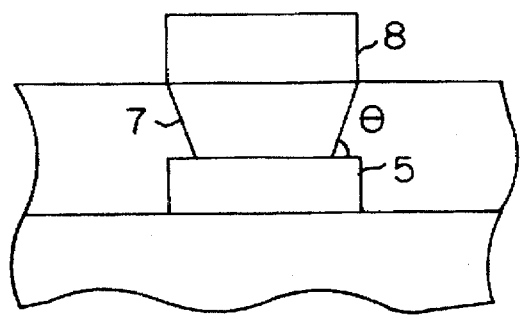
FIG. 10 is a schematic sectional view illustrating a prior art semiconductor device which adopts a multilayer wiring structure having a via hole formed in a taper shape.

Referring to FIG. 5, an example of dimensional characteristics for this embodiment of the semiconductor device will be described. In the second embodiment, the width of the first metallic wiring 5 is 0.60 μm, the diameter of the via hole 7 is 0.60 μm, the thickness of the second insulating film (i.e., the thickness of the upper and the lower portions from level of the top of the first metallic wiring 5) is 0.50 μm, the width of the via hole 7 extending laterally from the first metallic wiring 5 is 0.30 μm, and the taper angles of the via hole 7 (i.e., 90 and 75 degrees) are the same as those described above with respect to the first embodiment.

As noted, when etching the first metallic wiring 5, a depositional gas, such as $SiCl_4$, is used as the etching gas to form the desired taper ($\theta_3$) of approximately 80 degrees. At this time, etching of a bottom face of the via hole 7 extending laterally from the first metallic wiring 5 is made difficult by a lie-lag effect as the over-etching proceeds. Therefore, as the bottom face becomes narrower, leakage between the via hole 7 and the silicon substrate 1 or the gate electrodes 3' can be reduced or avoided. Furthermore, in the second embodiment the percentage of over-etching of the bottom face can be greater than that of the first embodiment, so as to further reduce or avoid leakage.

Next, referring to FIGS. 6 and 7, a third embodiment of the present invention will be described. In the third embodiment, the structure except the shape of the via hole 7 can be the same as that of the first embodiment. Therefore, the same or similar elements are identified by the same numbers and need not be discussed again.

Figure 6:
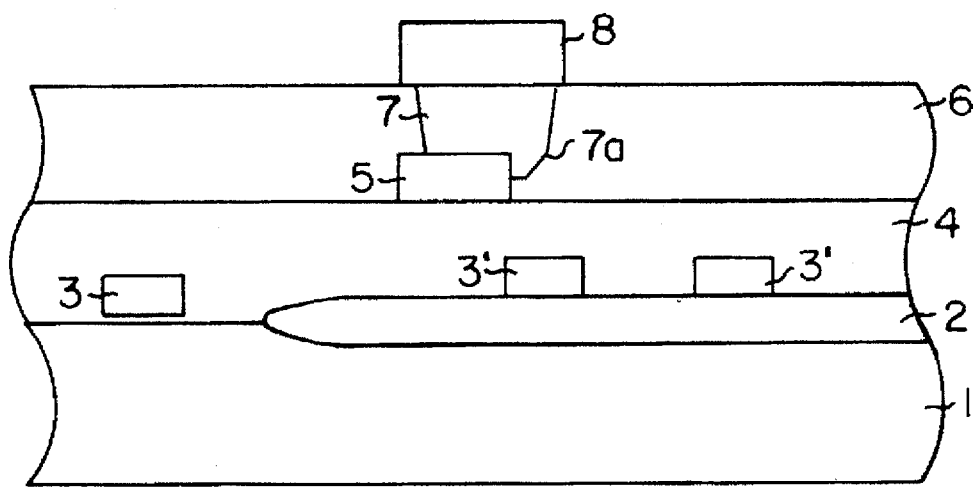
FIG. 6 is a schematic sectional view illustrating a semiconductor device of a third embodiment of the present invention.
Figure 7:
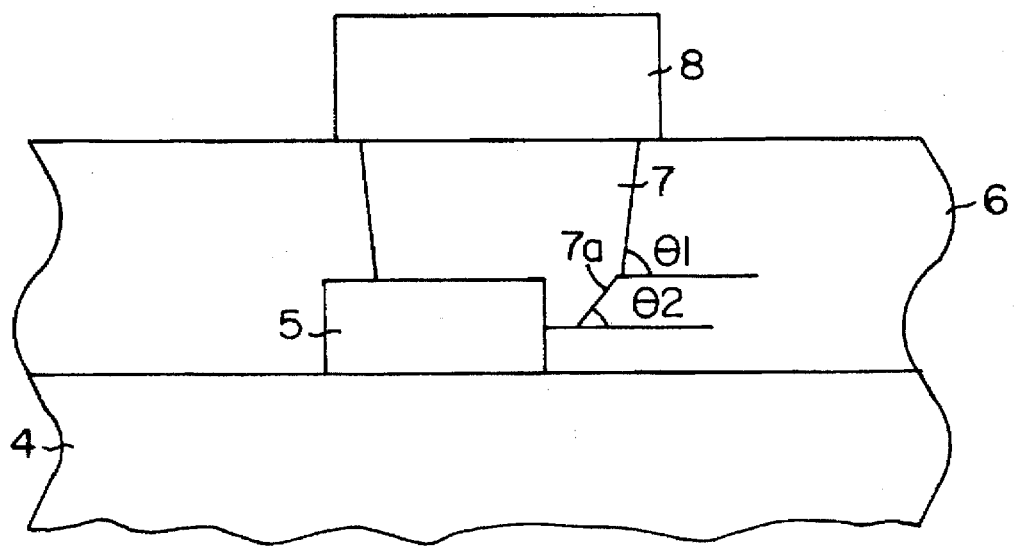
FIG. 7 is a schematic sectional view greatly enlarged of the semiconductor device of FIG. 6, illustrating a via hole connecting first and second wirings.
Figure 8:
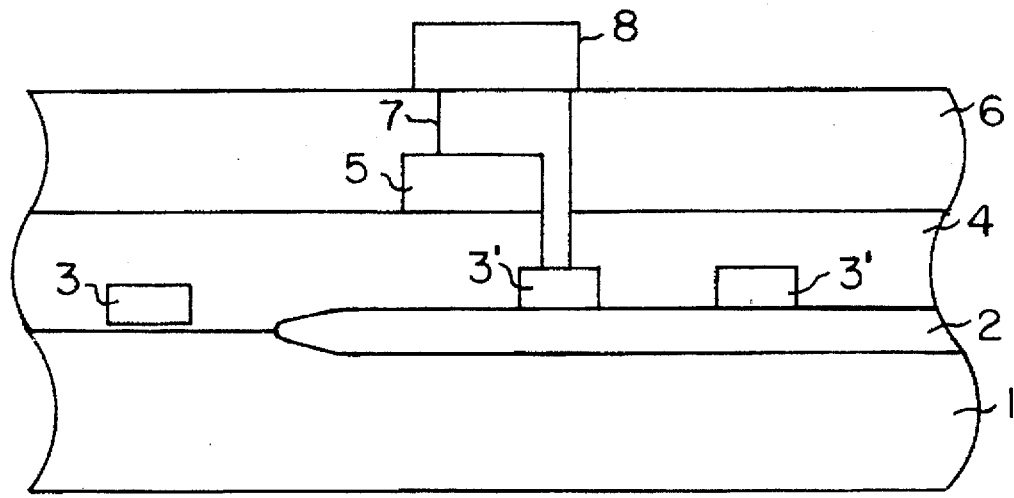
FIG. 8 is a schematic sectional view illustrating a prior art semiconductor device which adopts a multilayer wiring structure.
Figure 9:
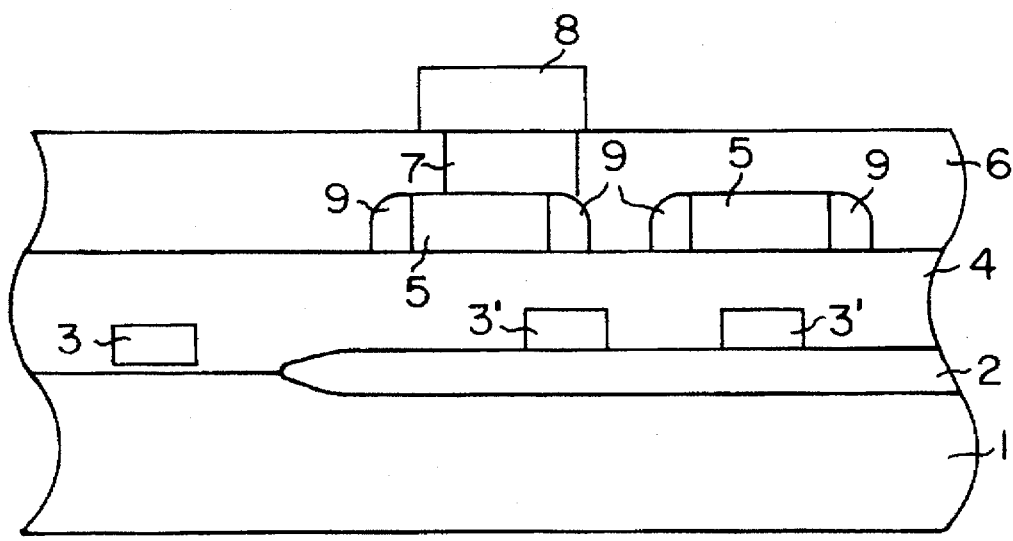
FIG. 9 is a schematic sectional view illustrating a prior art semiconductor device which adopts a multilayer wiring structure and side wall spacers.

In this third embodiment, as shown in FIGS. 6 and 7, the via hole is tapered in two steps and is provided to decrease the contact resistance between the via hole 7 and the wiring 5 and to increase the operational speed of the device. A first predefined taper angle ($\theta_1$), which is preferably 88 degrees or more, is formed in an upper portion 7b of the via hole 7 positioned over the top face 5a of the metallic wiring 5. A second predefined taper angle ($\theta_2$), which is 88 degrees or less, is formed in a lower portion 7a of the via hole 7 under the top face 5a of the metallic wiring 5, which is an over-etched portion.

As seen in FIG. 7, as the first taper angle ($\theta_1$) is formed in the upper portion 7b of the via hole 7, an area in which the via hole contacts with the first metallic wiring 5 is greater than in the case when the taper angle ($\theta_1$) is less than 88 degrees. Therefore, a contact resistance between the wirings when scaling down the semiconductor device can be reduced, and higher operation speeds of the semiconductor device can be achieved.

As the semiconductor device is scaled down further, the diameter of the via hole can be 0.50 μm or less, the width of the first metallic wiring 5 can be 0.50 μm, the diameter of the via hole 7 can be 0.50 μm, the total thickness of the second insulating film 6 can be 1.00 μm, the thickness of the upper portion of the second insulating film 6 over the upper face of the metallic wiring 5 can be 0.50 μm, the width of the via hole 7 extending laterally from the first metallic wiring 5 can be 0.20 μm. If the taper angle ($\theta_1$) is 80 degrees, the width of the area in which the via hole 7 contacts with the first metallic wiring 5 can be 0.20 μm. On the other hand, if the taper angle ($\theta_1$) is 88 degrees, the width of the area can be 0.29 μm. When scaling down, the difference of 0.10 μm between areas of contact can affect the contact resistance significantly. Therefore, high speed operation of the semiconductor device can be achieved by providing via holes having taper angles of 88 degrees or more on the upper portion thereof.

The present invention also provides methods for manufacturing the above described semiconductor devices which will now be described. A first method is as follows. As noted above, an end of a plasma etching cycle for forming the via hole 7 is detected by monitoring a luminous intensity in a known etching process. To illustrate, after etching the upper portion of the second insulating film over the top face 5a of the first metallic wiring 5, the amount of etching material is decreased and the end of the etching cycle is detected. To change the taper angle of via hole 7, an etching pressure is changed between before and after the end of the etching cycle. As a result, as shown in FIG. 6 and 7, the taper angles $\theta_1$ and $\theta_2$ of the via hole 7 are achieved. Though the typical pressure is different for the various methods and plasma etching systems utilized, when a typical pressure of 100 mTorr or more is used, the etching pressure is lowered to decrease the taper angle.

A second method is as follows. The end of the plasma etching cycle for forming the via hole 7 is similarly detected by monitoring the luminous intensity of the plasma. After etching the upper portion of the second insulating film 6 over the top face of the first metallic wiring 5, the amount of etched material is decreased and the end of the etching cycle is detected. A flow rate of an etching gas is changed between before and after the end of the etching cycle to over-etch the via hole. As a result, as seen in FIGS. 6 and 7, the taper angles $\theta_1$ and $\theta_2$ of the via hole 7 are achieved.

Usually when the silicon oxide film which is used as the insulating film 6 is etched, a depositional gas such as $CHF_3$ is mixed with an etching gas, such as $HF_4$ or $C_2F_6$, and the silicon oxide film is etched by the gas mixture. When the proportion of the depositional gas is higher, the taper angle is smaller.

A third method is as follows. As in the above methods, the end of the plasma etching cycle for forming the via hole 7 is detected by monitoring the luminous intensity of the plasma. As in the above methods, after etching the upper portion the second insulating film 6 over the top face the first metallic wiring 5, the amount of etching material is decreased and the end of the etching cycle is detected. The etching before the end of the etching cycle is executed by a gas including hydrogen, fluorine or carbon such as $CHF_3$, and a gas not including oxygen such as $CH_4$ or Ar. The etching after the end of that etching cycle (i.e., the over-etching cycle) is executed by a gas including hydrogen, fluorine or carbon, such as $CHF_3$, and a gas including oxygen such as $O_2$, CO or $CO_2$. In addition, after the end of that etching cycle, a gas not including oxygen such as $CH_4$ can be added.

As described above, the etching gas used is controllable and as a result, the taper angles $\theta_1$ and $\theta_2$ of the via hole 7 are controlled respectively, as seen in FIGS. 6 and 7. In the case of etching by a gas including oxygen, such as $O_2$, CO or $CO_2$, as compared to the case of the etching by a gas not including oxygen, the lie-lag effect in the former case is greater than in the latter case. Therefore, as the etching speed in the bottom face of the via hole 7 of the former case is slower than the etching speed in the latter case, leakage between the via hole 7 and the silicon substrate 1 or the gate electrodes 3' can be suppressed effectively.

As described above, according to the first embodiment of the present invention, as the taper is formed in the lower portion of the via hole 7 under the top face of the first metallic wiring 5, the via hole is kept from reaching the silicon substrate 1 or the gate electrodes 3' by a lie-lag effect. As a result, shorting and/or leakage between the via hole 7 and the silicon substrate 1 or the gate electrodes 3' can be suppressed.

According to the second embodiment of the present invention, as the taper is formed in the first metallic wiring 5, the area of the bottom face of the via hole 7 can be decreased further and the via hole can be kept from reaching the silicon substrate 1 or the gate electrodes 3' by the lie-lag effect. As a result, shorting and/or leakage between the via hole 7 and the silicon substrate 1 or the gate electrodes 3' can be suppressed.

According to the third embodiment of the present invention, as the taper, e.g., 88 degrees or more, is formed in the upper portion of the via hole 7 above the top face of the first metallic wiring 5, the area in which the via hole contacts with the first metallic wiring is increased as compared to the case when the taper angle is less than 88 degrees. When scaling down the semiconductor device, the contact resistance between the via hole 7 and the first metallic wiring 5 can be reduced and a higher speed operation of the semiconductor device can be achieved.

Numerous modifications and variations of the present invention are possible within the scope of the invention. It is therefore to be understood that, within the scope of the appended claims, the invention may be practiced in many ways different from those specifically described herein.

What is claimed is:

1. A semiconductor device comprising:
   a substrate formed of a semiconductor material;
   a first insulating film formed on the substrate;
   a first metallic wiring formed at least partially on the first insulating film;
   a second insulating film formed on the first insulating film;
   a second metallic wiring formed at least partially on the second insulating film; and
   a via hole for electrically connecting the first metallic wiring and the second metallic wiring, the via hole having a lower portion which extends to a level below a top face of the first metallic wiring, the lower portion being tapered so as to suppress leakage or shorting between the via hole and the substrate, wherein an upper portion of the via hole above a top face of the first metallic wiring has substantially vertical walls.

2. The semiconductor device of claim 1, wherein an angle of the taper is 88 degrees or less.

3. The semiconductor device of claim 1, wherein the first metallic wiring is at least partially tapered and an angle of the taper of the first metallic wiring is 88 degrees or less.

4. A semiconductor device comprising:
   a substrate of a semiconductor material;
   a first insulating film formed on the substrate;
   at least one gate electrode formed at least partially within the first insulating film;
   a first metallic wiring formed at least partially on the first insulating film;
   a second insulating film formed on the first insulating film;
   a second metallic wiring formed at least partially on the second insulating film; and
   a via hole for connecting the first metallic wiring and the second metallic wiring, the via hole having a lower portion which extends below a level of a top face of the first metallic wiring, the lower portion being tapered to keep the via hole electrically insulated from the substrate and the at least one gate electrode, wherein an upper portion of the via hole above a top face of the first metallic wiring has substantially vertical walls.

* * * * *